(12) United States Patent
Muniandy et al.

(10) Patent No.: US 8,853,058 B2
(45) Date of Patent: Oct. 7, 2014

(54) METHOD OF MAKING SURFACE MOUNT STACKED SEMICONDUCTOR DEVICES

(75) Inventors: Kesvakumar V. C. Muniandy, Klang (MY); Navas Khan Oratti Kalandar, Subang Jaya (MY); Lan Chu Tan, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 315 days.

(21) Appl. No.: 13/530,117

(22) Filed: Jun. 22, 2012

(65) Prior Publication Data

US 2013/0344656 A1    Dec. 26, 2013

(51) Int. Cl.
*H01L 21/00*    (2006.01)

(52) U.S. Cl.
USPC .......................................... 438/464; 438/108

(58) Field of Classification Search
USPC ................................................. 438/108, 464
See application file for complete search history.

(56) References Cited

U.S. PATENT DOCUMENTS

| 7,727,862 | B2 * | 6/2010 | Jobetto ......................... 438/464 |
| 7,993,972 | B2 | 8/2011 | Lin et al. |
| 8,216,918 | B2 * | 7/2012 | Gong et al. .................... 438/464 |
| 2011/0068444 | A1 * | 3/2011 | Chi et al. ....................... 257/669 |
| 2011/0068481 | A1 | 3/2011 | Park et al. |
| 2012/0104623 | A1 * | 5/2012 | Pagaila et al. ................. 257/774 |
| 2012/0119388 | A1 * | 5/2012 | Cho et al. ....................... 257/778 |
| 2012/0129298 | A1 * | 5/2012 | Lin et al. ....................... 438/118 |

* cited by examiner

*Primary Examiner* — James Mitchell
(74) *Attorney, Agent, or Firm* — Charles Bergere

(57) ABSTRACT

A method of assembling semiconductor devices includes providing a structure that includes an array of conductive frame members beside an array of apertures and an array of conductive vias that are exposed at a first face and extend towards a second face. An array of semiconductor dies is positioned in the array of apertures with their active faces positioned in the first face of the structure. The assembly is encapsulated from the second face of the structure and a redistribution layer is formed on the first face of the structure and the active faces of the die. Material is removed from the back face of the encapsulated array to expose the vias at the back face for connection through a further redistribution layer formed on the back face to electronic components stacked vertically on the further redistribution layer.

20 Claims, 3 Drawing Sheets

US 8,853,058 B2

METHOD OF MAKING SURFACE MOUNT STACKED SEMICONDUCTOR DEVICES

BACKGROUND OF THE INVENTION

The present invention is directed to a method of making surface mount semiconductor devices including semiconductor dies with vertically stacked electronic components.

Semiconductor device packaging fulfils basic functions such as providing electric connections and protecting the die against mechanical and environmental stresses. Continuing progress in reduction of the size of the semiconductor dies allows for reducing package size. However, the increased functionality and complexity of the circuits integrated in the dies requires increased external connections, which increases the complexity of reducing the package size.

Semiconductor dies typically are encapsulated for surface mounting. Such surface mount devices often include more than one embedded or encapsulated die. The electrical contacts for connection with external circuits are exposed at the active face of the package and connected internally with electrical contact pads on the semiconductor die. The contacts of the exposed device may be a ball grid array (BGA) or a land grid array (LGA), for example. Various techniques are available for connecting the exposed electrical contacts of the package with the internal contacts of the embedded semiconductor die.

Minimum values are specified for the size of the individual exposed electrical contact surfaces at the active face of the device and for the spacing between adjacent electrical contact surfaces. Such specifications necessitate a compromise between the overall size of the active face of the device and the number of individual electrical contact surfaces.

In a technique known as redistributed chip packaging (RCP), a redistribution layer provides interconnections between the internal contacts on the semiconductor die and the exposed device contacts at the active face of the device. In one technique of assembling embedded RCP devices, singulated dies are placed temporarily with their active faces on a substrate. The dies are encapsulated with a molding compound and then released from the substrate, thereby forming a panel of encapsulated dies. The panel is then processed with wafer processing techniques to build up a redistribution layer which 'fans out' the internal contacts of the die to the exposed contacts of the device. The redistribution layer covers an area greater than the area of the active face of the die. The redistribution layer may be built up by depositing successive layers of insulating material with electrical interconnectors in one or more layers, which may have vias providing connections between layers, separated by the insulating layers from each other and from unintended connection with conductive surfaces of the die. The interconnectors are typically deposited by electroplating, and patterned using batch process lithography. Connection with signal input/output and power and ground pads on the active faces of the dies may be made during electro-deposition of the interconnectors and vias. The devices are singulated after completion of the redistribution layer.

A surface mount device including one or more dies with one or more vertically stacked electronic components offers greater circuit complexity with the same or reduced area of the active face. Such a vertically stacked surface mount device may use different technologies such as 3D packaging, system in package (SIP), and package on package (POP), for example. The vertically stacked component may be a processor or a memory component, for example.

Typically, the exposed electrical contact elements of the device are connected with the vertically stacked components through a set of vertical vias. The provision of such vias poses manufacturing issues of reliability, productivity and cost, and is preferably performed without necessitating specific equipment or additional types of manufacturing processes. It would be advantageous to be able to form high quality and reliable vias.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

DETAILED DESCRIPTION OF THE INVENTION

Figure 1:
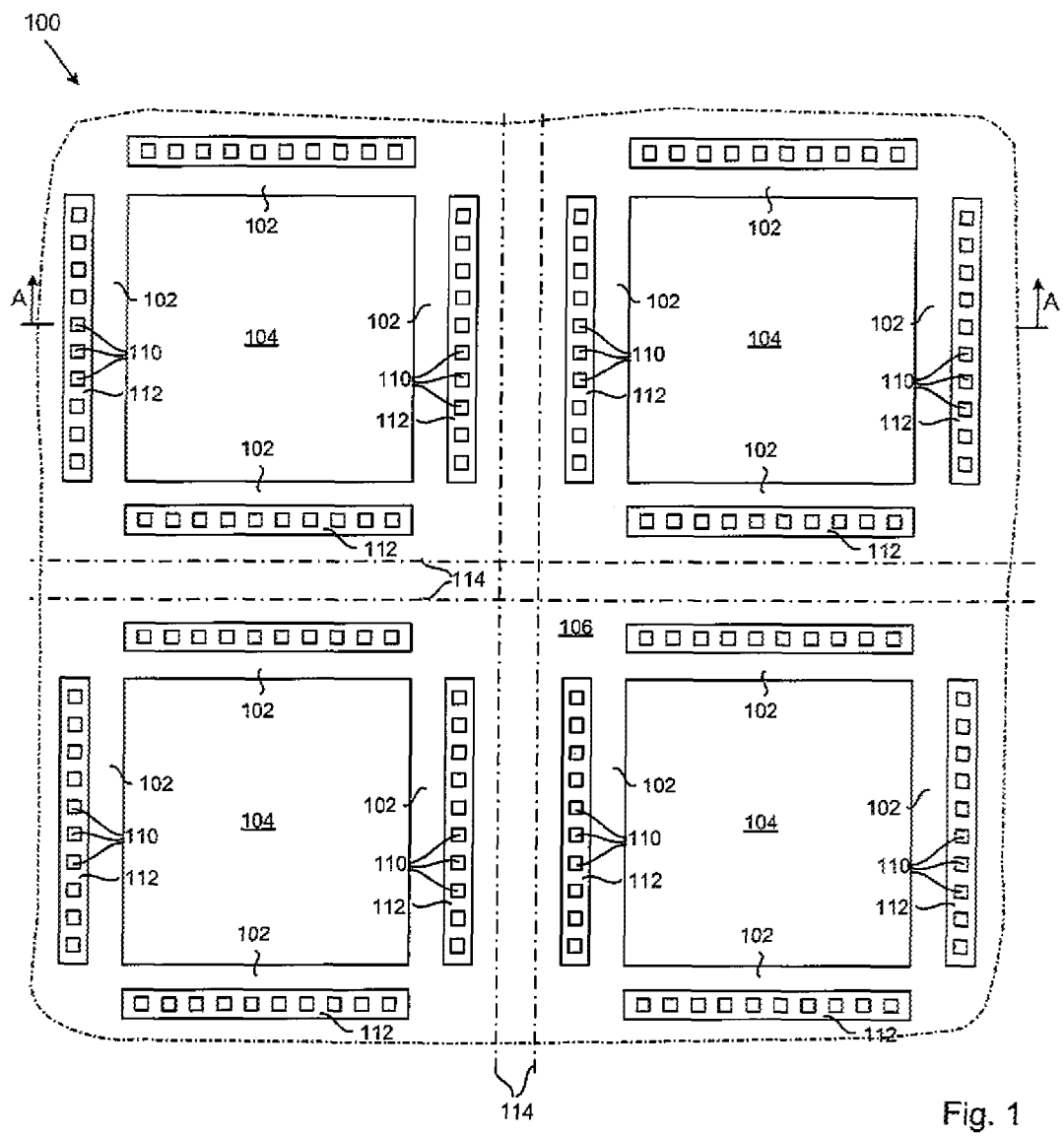
FIG. 1 is a plan view of part of a structure for use in a method of making vertically stacked surface mount semiconductor devices in accordance with an embodiment of the invention, given by way of example.
Figure 2:
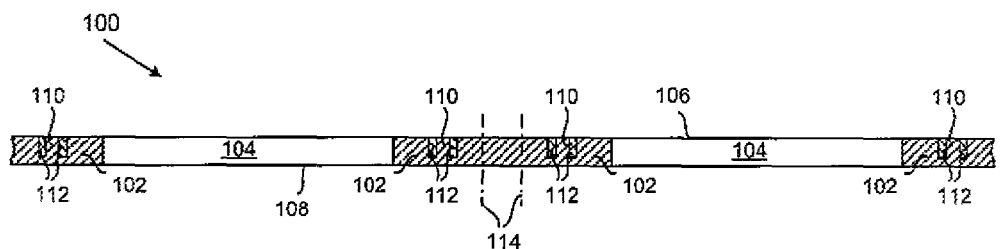
FIG. 2 is a sectional view along the line A-A of FIG. 1 of the structure of FIG. 1.

A method of assembling semiconductor devices, as illustrated in the drawings, uses a structure 100 part of which is shown in FIGS. 1 and 2. The structure 100 includes an array of sets of conductive frame members 102 extending beside an array of apertures 104 in which semiconductor dies will be positioned. The structure 100 and the dies will both be embedded in an encapsulant such as a molding compound. Such conductive frame members 102 may be part of an embedded ground plane, for example. In use of the finished device, such an embedded ground plane may be connected or capacitively coupled to ground or to a stable voltage source to shield the device from electromagnetic interference with external circuits or sources of noise, or from unwanted electromagnetic coupling between adjacent circuit elements, for example. In another example, the frame members 102 may be conductive lead-frame elements.

As shown in FIGS. 1 and 2, the structure 100 has opposed first and second faces 106 and 108, the array of apertures 104 extending between the opposed first and second faces. The array of sets of conductive frame members 102 extend between and beside the apertures 104. An array of sets of conductive via members 110 are exposed at the first face 106 and extend towards the second face 108. Via insulating material 112 surrounds the via members 110 laterally. The semiconductor devices will ultimately be singulated, for example by sawing along saw streets indicated in chain dotted lines at 114.

Figure 3:
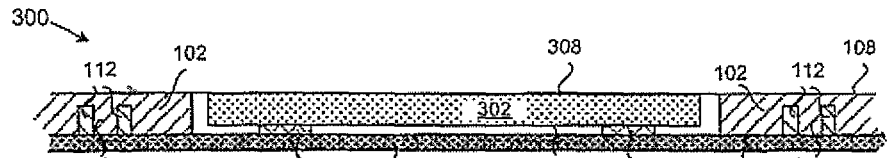
FIGS. 3 to 9 are similar sectional views of part of an array of vertically stacked surface mount semiconductor devices, including the structure of FIG. 1, at successive stages of a method of making the devices in accordance with an embodiment of the invention, given by way of example.
Figure 4:
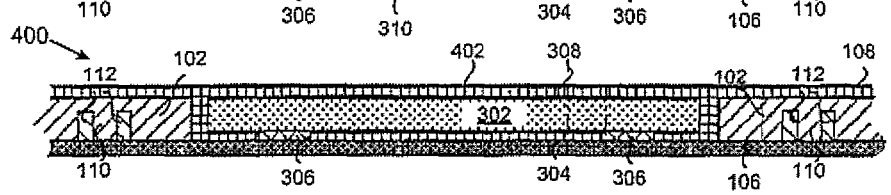
Figure 5:
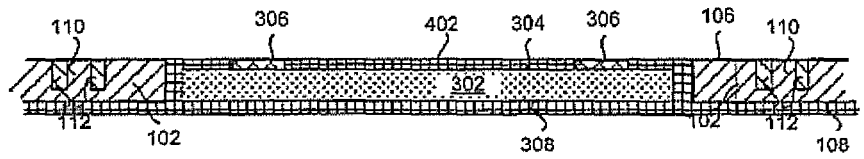
Figure 6:
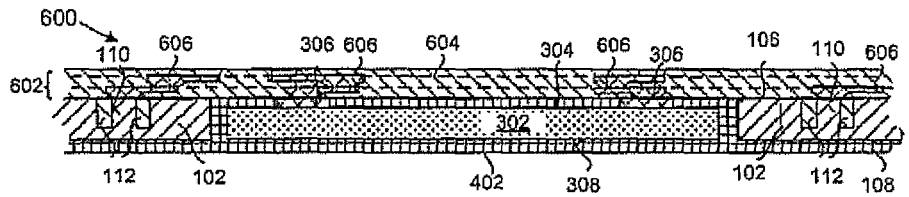

As shown in FIG. 3, the method of making surface mount semiconductor devices illustrated in the drawings includes forming an array 300 including the structure 100 and an array of semiconductor dies 302 positioned in the array of apertures 104. The semiconductor dies 302 each have an active face 304 presenting a die set of electrical contact elements 306 positioned in the first face 106 of the structure 100 and a further die face 308 opposite the active face 304. An encapsulated array 600 is formed as shown in FIGS. 4 to 6 including the array 300, with the second face 108 and the further die faces 308 embedded in an encapsulant 402, and with a redistribution layer 602 on the first face 106 and the active die faces 304. The redistribution layer includes a layer of redistribution insulating material 604, and an array of sets of redistribution conductors 606 within the redistribution insulating material 604.

Figure 7:
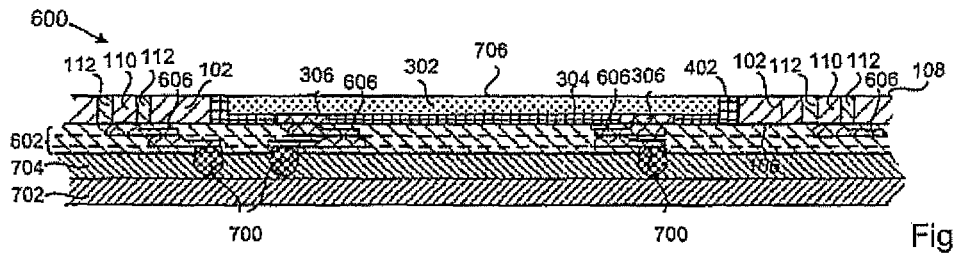
Figure 9:
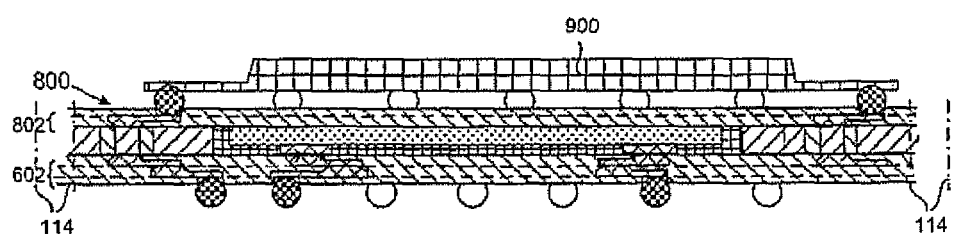

As shown in FIG. 7, an array of device sets of exposed electrical contact elements 700 are formed on the redistribution layer 602 with the sets of redistribution conductors 606 interconnecting the via members 110 and the electrical contact elements 306 of the die sets with electrical contact elements 700 of the device sets. FIG. 7 shows the array 600 with the electrical contact elements 700 after an optional step of mounting the array 600 on a carrier 702 with tape 704. Material of at least the structure 100 is removed from a back face 706 of the encapsulated array 600 opposite the redistribution layer 602 to expose the via members 110 individually at the back face 706 for connection to electronic components 900 stacked vertically on the back face (as shown in FIG. 9), the via insulating material 112 insulating the via members 110 from each other. In this example, material of the structure 100, of the array of dies 302 and of the encapsulant 402 is removed from a back face 706 of the encapsulated array 600, reducing the thickness of the encapsulated array 600. However, in another example, the structure 100 is thicker than the dies 302 and the encapsulant 402, and only material of the structure 100 is removed from the back face 706 to expose the via members 110 individually at the back face 706 for connection to electronic components 900. In this example, material of the structure 100 is removed from the back face 706 by grinding and/or laser ablation operations.

Figure 8:
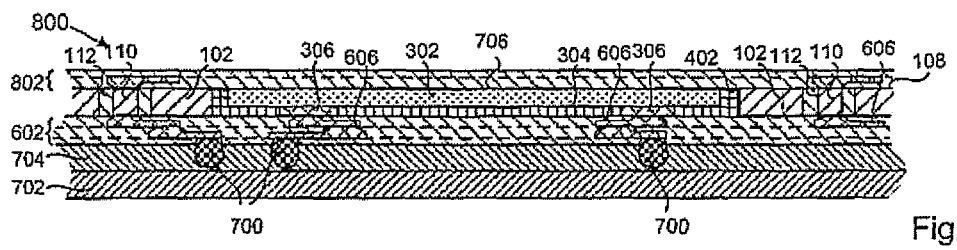

As shown in FIGS. 8 and 9, an array 800 is provided in this example by forming a further redistribution layer 802 on the back face 706. The electronic components 900 are mounted stacked vertically on the further redistribution layer 802, and connected with the via members 110 at the back face 706 to the electronic components 900 through the further redistribution layer 802. In this example, the electronic components 900 mounted on the back face 706 include packaged electronic components; in another example, the electronic components 900 mounted on the back face 706 include bare semiconductor dies, which are subsequently packaged with the array 800 as a whole.

This example of a method of assembling semiconductor devices includes singulating the devices after mounting the array of the electronic components 900 on the back face 706 and connecting the electronic components with the via members 110. In another example, the semiconductor devices of the array 800 are singulated after removing the carrier 702 and tape 704 and the electronic components 900 are mounted individually on the back face 706 and the electronic components connected with the via members 110 after singulation. The semiconductor devices are singulated in this example by sawing along saw streets indicated in chain dotted lines at 114.

In one example of an embodiment of the invention, the redistribution layer 602 is pre-fabricated, for example using lamination operations. The encapsulated array 600 is formed by mounting the array 300 with the first face 106 and the active die faces 304 on the redistribution layer 602 and encapsulating the assembly with the second face 108 and the further die faces 308 embedded in an encapsulant 402. Similar pre-fabrication techniques can be used for the redistribution layer 802.

However in this example of an embodiment of the invention, the redistribution layer 602 is built-up on the encapsulated array 400 shown in FIG. 4, allowing more precise positioning of the features and finer feature sizes. The encapsulated array 400 is formed by mounting the array 300 with the first face 106 and the active die faces 304 on a carrier 310, and encapsulating the array 300 including the structure 100 and the array of semiconductor dies 302 with the second face 108 and the further die faces 308 embedded in an encapsulant 402. The carrier 310 is removed as shown in FIG. 5. The redistribution layer 602 is formed on the first face 106 and the active die faces 304 of the encapsulated array 400, the redistribution layer 602 including a layer of redistribution insulating material 604, and an array of sets of redistribution conductors 606 within the redistribution insulating material 604 as shown in FIG. 6. Similar build-up techniques are used for the redistribution layer 802.

In an example of an embodiment of the invention, the structure 100 is provided by a method illustrated in FIGS. 10 to 17. Providing the structure 100 includes forming the array of apertures 104, the array of sets of conductive frame members 102, and the array of sets of conductive via members 110 in a sheet of conductive material 1000. Material of the sheet of conductive material 1000 is removed from the first face 106 to produce the via members 110 projecting within the sheet of conductive material 1000 and surrounded laterally by recesses 1200. The via insulating material 112 is introduced from the first face 106 into the recesses 1200 surrounding the via members 110 laterally.

Figure 10:
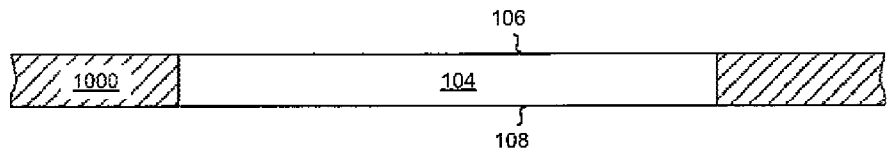
FIGS. 10 to 17 are a sectional views along the line A-A of FIG. 1 of part of the structure of FIG. 1 at successive stages of its production in an example of a method in accordance with an embodiment of the invention.

In more detail, the method of making the structure 100 illustrated in FIGS. 10 to 17 starts as shown in FIG. 10 by forming the sheet of conductive material 1000 with the array of apertures 104, for example by stamping and piercing, although other technologies may be used. The sheet 1000 is made of a suitable conductive material such as copper or aluminium. The thickness of the sheet 1000 is similar to the thickness of the dies 302 in this example, so that when material is removed from the back face 706 of the array 600, it is removed from the structure 100, the dies 302 and the encapsulant 402. In one example, the thickness of the sheet 1000 is 450 µm to 500 µm. In another example, the thickness of the sheet 1000 is greater than the thickness of the dies 302, so that when material is removed from the back face 706 of the array 600, it is removed primarily or solely from the structure 100. Removing material from the back face 706 of the array 600 may be performed by grinding and/or laser ablation operations, for example.

Figure 11:
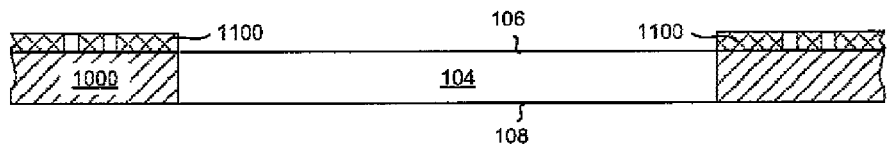
Figure 12:
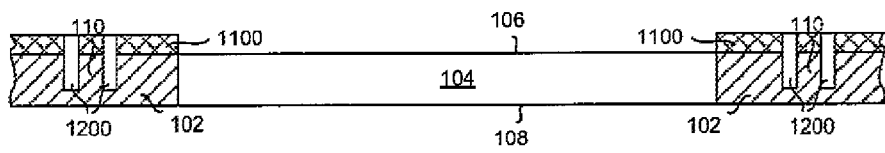
Figure 13:
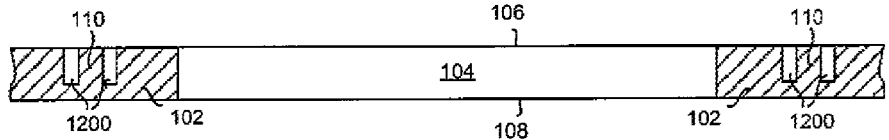

As shown in FIG. 11, a layer of photoresist 1100 is applied to the first face 106 of the sheet 1000 and patterned to define the array of sets of conductive frame members 102, and the array of sets of conductive via members 110. An array of sets of recesses 1200 are then etched in the sheet 1000 from the first face 106 in the pattern defined by the layer of photoresist 1100. The recesses 1200 provide the array of sets of conductive via members 110 in the form of pillars that are exposed at the first face 106 and extend towards the second face 108, projecting from and supported by material of the sheet 1000 at the second face 108 as shown in FIG. 12. The layer of photoresist 1100 is then removed by stripping, as shown in FIG. 13 and the via insulating material 112 is introduced from the first face 106 into the recesses 1200 to surround the via members 110 laterally.

Figure 14:
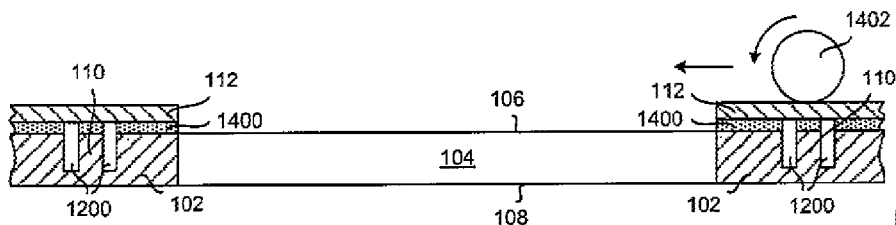
Figure 15:
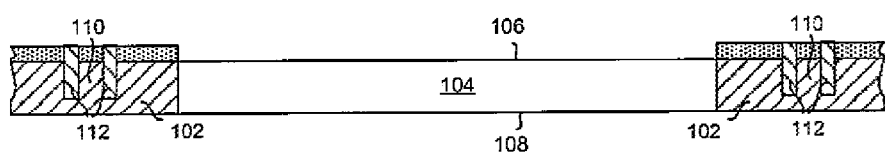
Figure 16:
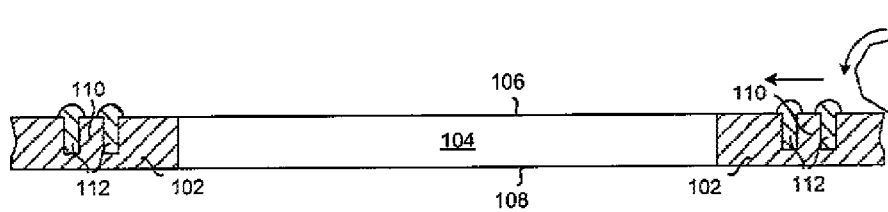
Figure 17:
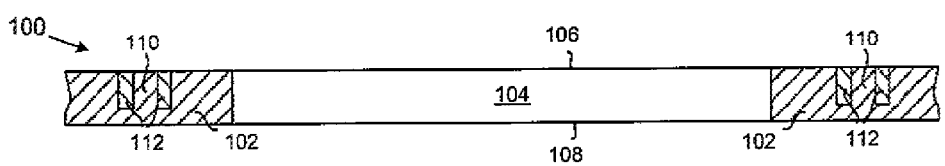

As shown in FIG. 14, in this example, the via insulating material 112 is applied as a layer of dielectric or polymer material on a screen printing stencil 1400 and pressed into the recesses 1200, as indicated schematically by a press roller 1402. The resulting structure, shown in FIG. 15, is cured, the stencil 1400 removed, and excess via insulating material 112 is removed, as indicated schematically by a buffering roller 1600 in FIG. 16, to produce the structure 100 shown in FIG. 17 and FIGS. 1 and 2.

Similar machines and similar processes can be used for providing the structure 100 for the redistribution layers 602 and 802. Higher productivity and reliability and lower costs can be achieved than with other techniques, such as building up the vias on a redistribution layer, or drilling the encapsulation and filling the through holes with via material.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor material of the dies described herein can be any semiconductor material or combinations of materials, such as gallium arsenide, silicon germanium, silicon-on-insulator (SOI), silicon, monocrystalline silicon, the like, and combinations of the above.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of making surface mount semiconductor devices, comprising:
   providing a structure having opposed first and second faces and including an array of apertures extending between said opposed first and second faces, an array of sets of conductive frame members extending between and beside said apertures, an array of sets of conductive via members exposed at said first face and extending towards said second face, and via insulating material surrounding said via members laterally;
   forming an encapsulated array including said structure and an array of semiconductor dies positioned in said array of apertures, said semiconductor dies each having an active face presenting a die set of electrical contact elements positioned in said first face of said structure and a further die face opposite said active face, with said second face and said further die faces embedded in an encapsulant, and a redistribution layer on said first face and said active die faces, said redistribution layer including a layer of redistribution insulating material, and an array of sets of redistribution conductors within said redistribution insulating material;
   providing an array of device sets of exposed electrical contact elements on said redistribution layer with said sets of redistribution conductors interconnecting said via members and said electrical contact elements of said die sets with electrical contact elements of said device sets; and
   removing material of at least said structure from a back face of said encapsulated array opposite said redistribution layer to expose said via members individually at said back face for connection to electronic components stacked vertically on said back face, said via insulating material insulating said via members from each other.

2. The method of claim 1, wherein said removing material from said back face of said encapsulated array includes removing material of said structure, of said array of dies and of said encapsulant.

3. The method of claim 1, further comprising mounting an array of said electronic components on said back face and connecting said electronic components with said via members.

4. The method of claim 3, wherein said electronic components mounted on said back face include packaged electronic components.

5. The method of claim 3, further comprising singulating the devices after mounting said array of said electronic components on said back face and connecting said electronic components with said via members.

6. The method of claim 1, further comprising providing a further redistribution layer on said back face, mounting said electronic components stacked vertically on said further redistribution layer, and connecting said via members at said back face to said electronic components through said further redistribution layer.

7. The method of claim 1, wherein forming said encapsulated array includes mounting said structure and said semiconductor dies with said first face and said active die faces contacting a substrate, applying said encapsulant to encapsulate said structure and said array of semiconductor dies, and removing said substrate.

8. The method of claim 1, wherein providing said structure includes forming said array of apertures, said array of sets of conductive frame members, and said array of sets of conductive via members in a sheet of conductive material.

9. The method of claim 8, wherein providing said structure includes removing material of said sheet of conductive material from said first face to produce said via members projecting within said sheet of conductive material and surrounded laterally by recesses.

10. The method of claim 9, wherein providing said structure includes introducing said via insulating material from said first face into said recesses surrounding said via members laterally.

11. A method of making surface mount semiconductor devices, comprising:

providing a structure having opposed first and second faces and including an array of apertures extending between said opposed first and second faces, an array of sets of conductive frame members extending between and beside said apertures, an array of sets of conductive via members exposed at said first face and extending towards said second face, and via insulating material surrounding said via members laterally;

positioning in said array of apertures an array of semiconductor dies each having an active face presenting a die set of electrical contact elements positioned in said first face of said structure and a further die face opposite said active face;

forming an encapsulated array including said structure and said array of semiconductor dies with said second face and said further die faces embedded in an encapsulant;

forming a redistribution layer on said first face and said active die faces of said encapsulated array, said redistribution layer including a layer of redistribution insulating material, and an array of sets of redistribution conductors within said redistribution insulating material;

providing an array of device sets of exposed electrical contact elements on said redistribution layer with said sets of redistribution conductors interconnecting said via members and said electrical contact elements of said die sets with electrical contact elements of said device sets; and removing material of at least said structure from a back face of said encapsulated array opposite said redistribution layer to expose said via members individually at said back face for connection to electronic components stacked vertically on said back face, said insulating material insulating said via members from each other.

12. The method of claim 11, wherein said removing material from said back face of said encapsulated array includes removing material of said structure, of said array of dies and of said encapsulant.

13. The method of claim 11, and including mounting an array of said electronic components on said back face and connecting said electronic components with said via members.

14. The method of claim 13, wherein said electronic components mounted on said back face include packaged electronic components.

15. The method of claim 13, further comprising singulating the devices after mounting said array of said electronic components on said back face and connecting said electronic components with said via members.

16. The method of claim 11, wherein forming said encapsulated array includes mounting said structure and said semiconductor dies with said first face said active die faces contacting a substrate, applying said encapsulant to encapsulate said structure and said array of semiconductor dies, and removing said substrate.

17. The method of claim 11, further comprising providing a further redistribution layer on said back face, mounting said vertically stacked electronic components on said further redistribution layer, and connecting said via members at said back face to said electronic components with said further redistribution layer.

18. The method of claim 11, wherein providing said structure includes forming said array of apertures, said array of sets of conductive frame members, and said array of sets of conductive via members in a sheet of conductive material.

19. The method of claim 18, wherein providing said structure includes removing material of said sheet of conductive material from said first face to produce said via members projecting within said sheet of conductive material and surrounded laterally by recesses.

20. The method of claim 19, wherein providing said structure includes introducing said via insulating material from said first face into said recesses surrounding said via members laterally.

\* \* \* \* \*